(12) United States Patent
Ziazadeh

(10) Patent No.: US 7,019,678 B1
(45) Date of Patent: Mar. 28, 2006

(54) DIGITAL-TO-ANALOG CONVERTER WITH CONSTANT DIFFERENTIAL GAIN AND METHOD

(75) Inventor: Ramsin M. Ziazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/036,765

(22) Filed: Jan. 14, 2005

(51) Int. Cl.
*H03M 1/66* (2006.01)

(52) U.S. Cl. ..................................... 341/144
(58) Field of Classification Search ............... 341/144, 341/153; 327/538, 541
See application file for complete search history.

(56) References Cited

U.S. PATENT DOCUMENTS

| | | | | |
|---|---|---|---|---|
| 5,343,094 A | * | 8/1994 | Nguyen | 326/63 |
| 6,288,575 B1 | * | 9/2001 | Forbes | 327/57 |
| 6,633,447 B1 | * | 10/2003 | Franck et al. | 360/67 |
| 6,639,456 B1 | * | 10/2003 | Paulus | 327/545 |
| 6,747,695 B1 | * | 6/2004 | Afghahi | 348/241 |

* cited by examiner

*Primary Examiner*—Peguy JeanPierre

(57) ABSTRACT

A digital-to-analog converter is provided that includes an input stage and an output stage. The input stage is operable to receive a digital bit of data, to convert the digital bit into a quasi-differential current, and to convert the quasi-differential current into a first voltage using a load that is comprised of transconductance and resistance. The output stage is coupled to the input stage and is operable to generate analog data based on the first voltage.

20 Claims, 2 Drawing Sheets

DIGITAL-TO-ANALOG CONVERTER WITH CONSTANT DIFFERENTIAL GAIN AND METHOD

TECHNICAL FIELD OF THE INVENTION

The present invention relates generally to integrated circuits and, more particularly, to a digital-to-analog converter with constant differential gain and method.

BACKGROUND OF THE INVENTION

Digital-to-analog converter blocks are often used in mixed-signal based integrated circuits to interface between a digital-based engine and analog blocks. Such architectures are widely used in various data communications products, in addition to many other types of products. For example, a digital-to-analog converter may be used for providing a DC offset cancellation in a servo loop of a communication channel where the DC offset is sensed through the digital domain and cancelled in the analog domain via the digital-to-analog conversion.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
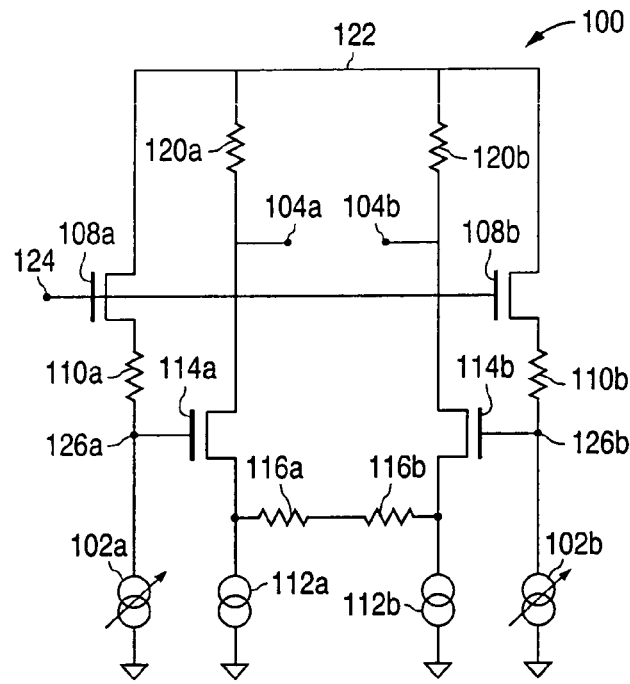
FIG. 1 is a circuit diagram illustrating a digital-to-analog converter with constant differential gain in accordance with one embodiment of the present invention.
Figure 2:
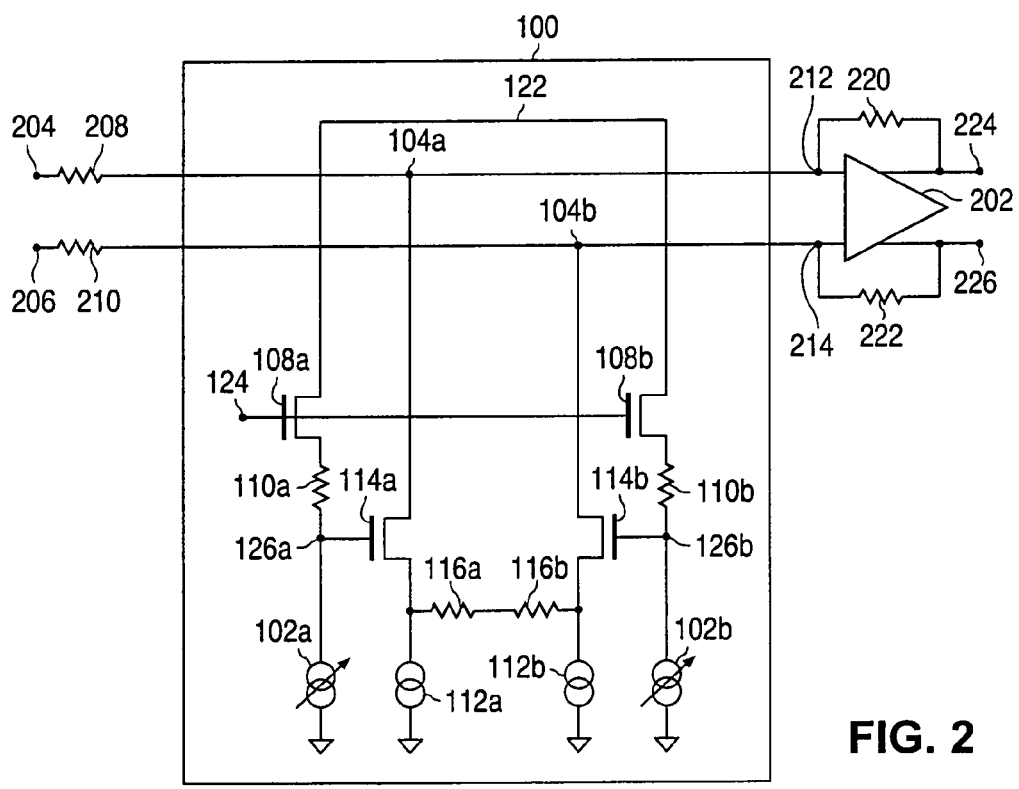
FIG. 2 is a circuit diagram illustrating the digital-to-analog converter of FIG. 1 implemented in a particular application in accordance with one specific embodiment of the present invention.
Figure 3:
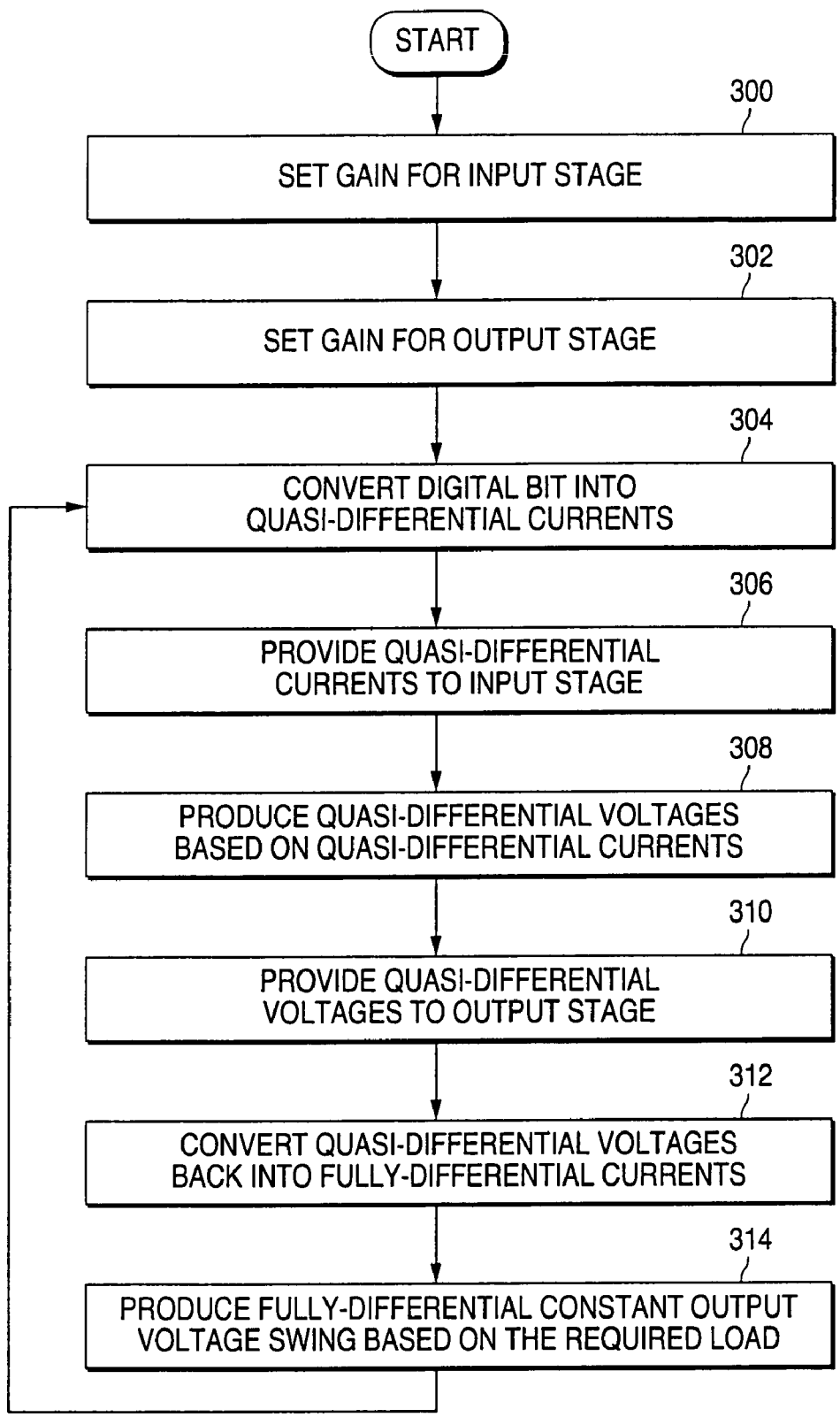
FIG. 3 is a flow diagram illustrating a method for providing digital-to-analog conversion using the digital-to-analog converter of FIG. 1 in accordance with one embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged digital-to-analog converter.

FIG. 1 is a circuit diagram illustrating a digital-to-analog converter 100 with constant differential gain in accordance with one embodiment of the present invention. As illustrated in FIG. 1, the digital-to-analog converter 100 may comprise a differential current source into a polysilicon (poly) resistor load.

The digital-to-analog converter 100 is operable to receive as an input an N-bit digital word and convert the digital bits into two quasi-differential currents. These currents are provided in the digital-to-analog converter 100 by two input current sources 102a and 102b. The digital-to-analog converter 100 is also operable to generate as an output an analog signal in the form of two fully-differential voltages at output nodes 104a and 104b.

Associated with each input current source 102, the digital-to-analog converter 100 also comprises a first transistor 108 and a first resistor 110 that makeup an input stage and a second current source 112, a second transistor 114 and a second resistor 116 that makeup an output stage.

The illustrated embodiment also includes a load resistor 120 for each output node 104, which represents the resistance of a load (not explicitly shown in FIG. 1) that is coupled to the digital-to-analog converter 100 and that is operable to receive the analog output from the digital-to-analog converter 100.

The digital-to-analog converter 100 is powered by a power supply 122 that is operable to provide a specified voltage to the digital-to-analog converter 100. According to one embodiment, the power supply 122 is operable to provide about 1.8V to 3.3V; however, it will be understood that the power supply 122 may be operable to provide any other suitable voltage without departing from the scope of the present invention. In addition, the digital-to-analog converter 100 is operable to receive a bias voltage 124 at each of the first transistors 108. According to one embodiment, the bias voltage may comprise about 1.8V to 3.3V; however, it will be understood that the bias voltage 124 may comprise any other suitable voltage without departing from the scope of the present invention.

In operation, according to one embodiment, one bit of an N-bit digital word is converted into quasi-differential currents that are provided by the input current sources 102 of the digital-to-analog converter 100. These quasi-differential currents, which track with poly resistor variations over process and temperature, flow into an impedance comprised of first resistors 110 and transconductance of first transistors 108 that form the input stage and produce quasi-differential voltages at nodes 126.

These voltages are then fed into a fully-differential transconductance output stage with second resistors 116 used as the source degeneration. The voltages are converted into current by stirring a specified amount of tail currents into the load using the second current sources 112, which produces differential output voltages at the output nodes 104. The amount of the specified currents generated by the second current sources 112a and 112b track with poly resistor variations over process and temperature also and may be determined based on the resistances of the load 120a and 120b in accordance with differential output swing and bandwidth conditions.

The voltage, V, at either of the nodes 126a or 126b may be written as:

$$V = Ipoly1 * (R1 + 1/Gm1),$$

where Ipoly1 is the current represented by the input current source 102a or 102b, R1 is the resistance of the first resistor 110a or 110b, and Gm1 is the transconductance of the first transistor 108a or 108b.

The output voltage, $V_o$, at either of the output nodes 104a or 104b may be written as:

$$V_o = V * [1/(R2 + 1/Gm2)] * R_L,$$

where R2 is the resistance of the second resistor 116a or 116b, Gm2 is the transconductance of the second transistor 114a or 114b, and $R_L$ is the resistance of the load resistor 120a or 120b. Thus, the output voltage, $V_o$, may also may be written as:

$$V_o = Ipoly1 * [(R1 + 1/Gm1)/(R2 + 1/Gm2)] * R_L.$$

Therefore, as shown in the above equations, the voltages at the nodes 126a and 126b are quasi-differential voltages generated from Ipoly1. These voltages are then converted back into currents proportional to the effective transconductance of the differential pair of second transistors 114a and 114b, which include the source degeneration second resistors 116a and 116b. The first transistors 108 track with the second transistors 114, and the first resistors 110 track with the second resistors 116.

The gain through the input stage of the digital-to-analog converter 100 ((R1+1/Gm1)/(R2+1/Gm2)) may be set to the desired ratio and the output stage gain may be set by Ipoly1*$R_L$, which produces a relatively constant gain and swing at the output nodes 104 of the digital-to-analog converter 100 that are fully differential in nature with common-mode rejection. In addition, the limited output swing, $S_o$, may be written as:

$$S_o = Ipoly2 * R_L,$$

which is also relatively constant over process, voltage and temperature variations.

For one embodiment, the first resistors 110 and the second resistors 116 may comprise poly resistors in order to further linearize the transconductance of the first and second transistors 108 and 116 and thereby support a wide dynamic range in the differential output current.

In addition, according to one embodiment, the first resistors 110a and 110b may each comprise a resistance of approximately 1K–10KΩ and the second resistors 116a and 116b may each comprise a resistance of approximately 1K–10KΩ. However, it will be understood that the resistors 110 and 116 may comprise any suitable resistances without departing from the scope of the present invention.

In this way, the digital-to-analog converter 100 may convert a digital bit of data into a quasi-differential weighted summing current. The summed current may be a poly resistor type-based current such that it tracks over poly resistor process and temperature variations. The current may then be converted into voltage by a load that is comprised of transconductance and poly resistance. Furthermore, the voltage may then be fed into a differential stage that uses poly resistors in the sources of the input pair transistors 114 to degenerate the transconductance and, thus, track the input voltage. The resulting current is a true fully-differential current that does not depend on the transconductance of the differential pair of transistors 114 and provides relatively constant gain and swing with respect to the poly resistor load 120 coupled to the output nodes 104 of the differential pair 114.

FIG. 2 is a circuit diagram illustrating the digital-to-analog converter 100 implemented in a particular application in accordance with one specific embodiment of the present invention. For this embodiment, the digital-to-analog converter 100 is implemented as a DC offset canceller, which may be used in a communication channel or other suitable application. It will be understood that this is simply one example of an application in which the digital-to-analog converter 100 may be implemented and that many other implementations are also possible.

The digital-to-analog converter 100 in the illustrated embodiment is operable to inject a DC offset cancellation current into an operational amplifier 202. The operational amplifier 202 is operable to receive two differential inputs 204 and 206, each of which comprises an associated resistance 208 and 210, at two input nodes 212 and 214. The operational amplifier 202 is also operable, in conjunction with two feedback resistors 220 and 222, to amplify the inputs received at the input nodes 212 and 214 in order to generate two differential outputs at two output nodes 224 and 226.

Because the operational amplifier 202 will generally comprise an offset due to slight imperfections within the circuits of the operational amplifier 202, the digital-to-analog converter 100 is operable to substantially cancel that offset by injecting a differential current into the input nodes 212 and 214 of the operational amplifier 202 that will allow the operational amplifier 202 to function more closely to its ideal. Thus, the outputs provided by the digital-to-analog converter 100 at the output nodes 104a and 104b are added to the inputs received at the input nodes 212 and 214 of the operational amplifier 202, thereby improving the performance of the operational amplifier 202.

FIG. 3 is a flow diagram illustrating a method for providing digital-to-analog conversion using the digital-to-analog converter 100 in accordance with one embodiment of the present invention. The method begins at step 300 where the gain through the input stage of the digital-to-analog converter 100 is set to the desired ratio by using the following equation:

$$Gain_{IN} = (R1 + 1/Gm1)/(R2 + 1/Gm2).$$

At step 302, the gain through the output stage is set by using the following equation:

$$Gain_{OUT} = Ipoly1 * R_L,$$

which produces a relatively constant gain and swing at the output nodes 104 of the digital-to-analog converter 100.

At step 304, a bit of a digital word is converted into quasi-differential currents provided by the input current sources 102 of the digital-to-analog converter 100. At step 306, the quasi-differential currents are provided to the input stage of the digital-to-analog converter 100, which corresponds to an impedance comprised of first resistors 110 and transconductance of first transistors 108.

At step 308, quasi-differential voltages are produced at nodes 126 based on the quasi-differential currents. At step 310, the quasi-differential voltages are fed into the output stage, which is a differential transconductance stage comprising second resistors 116 used as the source.

At step 312, the quasi-differential voltages are converted back into fully-differential currents by stirring a specified amount of tail currents into the load using the second current sources 112. The amount of the specified currents generated by the second current sources 112a and 112b may be determined based on the limited output swing requirement. The currents into which the voltages are converted in step 312 are proportional to the effective transconductance of the differential pair of second transistors 114a and 114b, which include the source degeneration second resistors 116a and 116b.

At step 314, fully-differential output voltages are produced at the output nodes 104 based on the currents into which the voltages are converted in step 312. This results in a fully-differential, relatively constant output voltage swing that is produced based on the required load. At this point the method returns to step 304 where the next bit to be converted from digital data into analog data is converted into quasi-differential currents.

In this way, a single differential pair may be used in the signal path, which allows a reduction in capacitance. In addition, constant swing and gain over process and temperature variations for a digital-to-analog converter 100 is provided, and power and space requirements are lowered. Thus, using the digital-to-analog converter 100, a differential current may be provided into a load as a function of digital inputs that may be utilized, for example, in high-speed communication channels by providing open-loop constant gain and swing across the output loads.

Although the present invention has been described with several embodiments, various changes and modifications may be suggested to one skilled in the art. It is intended that the present invention encompass such changes and modifications as fall within the scope of the appended claims.

What is claimed is:

1. A digital-to-analog converter, comprising:
   an input stage operable to receive a digital bit of data, to convert the digital bit into a quasi-differential current, and to convert the quasi-differential current into a first voltage using a load that is comprised of transconductance and resistance; and
   an output stage coupled to the input stage, the output stage operable to generate analog data based on the first voltage.

2. The digital-to-analog converter of claim 1, the input stage comprising a first and a second transistor, a first resistor coupled to a source of the first transistor, and a second resistor coupled to a source of the second transistor.

3. The digital-to-analog converter of claim 1, the quasi-differential current comprising a weighted summed current.

4. The digital-to-analog converter of claim 1, the quasi-differential current comprising a polysilicon resistor type-based current.

5. The digital-to-analog converter of claim 1, the output stage comprising a first and a second transistor, a first resistor coupled to a source of the first transistor, and a second resistor coupled to a source of the second transistor and to the first resistor.

6. The digital-to-analog converter of claim 5, the output stage further comprising a first and a second current source, the first current source coupled to the source of the first transistor, and the second current source coupled to the source of the second transistor.

7. The digital-to-analog converter of claim 1, the output stage further operable to degenerate the transconductance of the input stage to track the first voltage.

8. The digital-to-analog converter of claim 1, the input stage comprising a first and a second input transistor, a first input resistor coupled to a source of the first input transistor, and a second input resistor coupled to a source of the second input transistor, and the output stage comprising a first and a second output transistor, a first output resistor coupled to a source of the first output transistor, and a second output resistor coupled to a source of the second output transistor and to the first output resistor.

9. The digital-to-analog converter of claim 8, the first and second input resistors and the first and second output resistors comprising polysilicon resistors.

10. A digital-to-analog converter, comprising:
    an input stage comprising a first and a second input transistor, a first input resistor coupled to a source of the first input transistor, and a second input resistor coupled to a source of the second input transistor, the input stage operable to generate a first and second input current based on a digital bit of data and to generate a first input voltage based on the first input current and a second input voltage based on the second input current; and
    an output stage coupled to the input stage, the output stage comprising a first and a second output transistor, a first output resistor coupled to a source of the first output transistor, a second output resistor coupled to a source of the second output transistor and to the first output resistor, and a first and second current source, the output stage operable to receive the first and second input voltages and to generate a first output voltage based on the first input voltage and a second output voltage based on the second input voltage, the first and second output voltages corresponding to analog data generated based on the digital bit of data.

11. The digital-to-analog converter of claim 10, the first and second input currents comprising quasi-differential currents.

12. The digital-to-analog converter of claim 11, the quasi-differential currents comprising weighted summed currents.

13. The digital-to-analog converter of claim 11, the quasi-differential currents comprising polysilicon resistor type-based currents.

14. The digital-to-analog converter of claim 10, the output stage further operable to degenerate the transconductance of the input stage to track the first and second input voltages.

15. The digital-to-analog converter of claim 10, the first and second input resistors and the first and second output resistors comprising polysilicon resistors.

16. A method for converting digital data to analog data, comprising:
    receiving a digital bit of data;
    converting the digital bit into a quasi-differential current;
    converting the quasi-differential current into a first voltage using a load that is comprised of transconductance and resistance; and
    generating analog data based on the first voltage.

17. The method of claim 16, generating analog data based on the first voltage comprising converting the first voltage into a second current and producing a fully-differential output voltage based on the second current, the fully-differential output voltage corresponding to the analog data.

18. The method of claim 17, converting the first voltage into a second current comprising stirring a specified amount of tail current into a load.

19. The method of claim 18, the specified amount of tail current determined based on the gain and swing at the resistance of the load.

20. The method of claim 16, the quasi-differential current comprising a weighted summed current.

* * * * *